(12) United States Patent
Kuttner

(10) Patent No.: US 8,325,072 B2
(45) Date of Patent: Dec. 4, 2012

(54) CALIBRATION CIRCUIT AND METHOD FOR CALIBRATING CAPACITIVE COMPENSATION IN DIGITAL-TO-ANALOG CONVERTERS

(75) Inventor: Franz Kuttner, St. Ulrich (AT)

(73) Assignee: Intel Mobile Communications GmbH, Neubiberg (DE)

( * ) Notice: Subject to any disclaimer, the term of this patent is extended or adjusted under 35 U.S.C. 154(b) by 151 days.

(21) Appl. No.: 12/987,314

(22) Filed: Jan. 10, 2011

(65) Prior Publication Data

US 2012/0176258 A1     Jul. 12, 2012

(51) Int. Cl.
*H03M 1/10* (2006.01)
*H03M 1/66* (2006.01)

(52) U.S. Cl. ........ 341/136; 341/120; 341/144; 327/382; 327/390

(58) Field of Classification Search ................... 341/136, 341/144, 153; 327/379, 382, 389, 390, 391, 327/431, 434, 534
See application file for complete search history.

(56) References Cited

U.S. PATENT DOCUMENTS

| | | | | |
|---|---|---|---|---|
| 5,021,784 A | * | 6/1991 | Groeneveld et al. | 341/120 |
| 5,148,065 A | * | 9/1992 | Krenik et al. | 327/382 |
| 5,475,323 A | * | 12/1995 | Harris et al. | 327/67 |
| 5,548,238 A | * | 8/1996 | Zhang et al. | 327/374 |
| 6,806,692 B2 | * | 10/2004 | Lee | 323/277 |
| 6,833,801 B1 | * | 12/2004 | Ostrem et al. | 341/144 |
| 7,295,068 B2 | * | 11/2007 | Capofreddi et al. | 330/254 |
| 7,307,463 B2 | * | 12/2007 | Miyake et al. | 327/437 |
| 7,489,261 B1 | | 2/2009 | Kuttner | |
| 7,675,442 B2 | * | 3/2010 | Kuttner | 341/136 |
| 7,944,381 B2 | * | 5/2011 | Kuttner | 341/136 |
| 2003/0001656 A1 | * | 1/2003 | Tucholski et al. | 327/393 |
| 2007/0210946 A1 | * | 9/2007 | Hsieh | 341/120 |

\* cited by examiner

*Primary Examiner* — Howard Williams
(74) *Attorney, Agent, or Firm* — Eschweiler & Associates, LLC

(57) ABSTRACT

A digital-to-analog converter converts a digital input signal into an analog output signal. The digital-to-analog converter includes an input selector configured to input the digital input signal and an output terminal configured to output the analog signal. An array of current source cells is provided. Each current source cell includes a current source transistor having a gate terminal and a source terminal, a current source switch for coupling the source terminal to the output terminal based on the digital input signal, and a compensation capacitor configured to compensate a capacitive feedback between the gate terminal and the source terminal when the source terminal is coupled to the output terminal. At least one of the current source cells further includes a calibration circuit configured to detect a voltage variation at the gate terminal and provide a compensation voltage for the compensation capacitor.

21 Claims, 7 Drawing Sheets

CALIBRATION CIRCUIT AND METHOD FOR CALIBRATING CAPACITIVE COMPENSATION IN DIGITAL-TO-ANALOG CONVERTERS

TECHNICAL FIELD

Embodiments described herein relate to an electronic circuit for converting digital input signals into analog output signals, and in particular relate to a single-ended digital-to-analog converter having switchable current source cells for converting a digital input signal into an analog output signal and a method for converting a digital input signal into an analog output signal.

BACKGROUND

Digital-to-analog converters (DACs) for converting a digital input signal into an analog output signal may include a plurality of current source cells which are controlled by a digital input signal. Output currents of the individual current source cells are added up so that a sum current is provided as an analog output signal. Furthermore, digital-to-analog converters may be designed in single-ended and in differential set-ups.

Single-ended digital-to-analog converters have lower power consumption as compared to differential digital-to-analog converters. Single-ended digital-to-analog converters, however, may provide a distorted output signal due to a capacitive feedback (capacitance feedback) into a gate of a current source transistor provided in a current source cell, when the current source cell is switched to an output line. Thus, when summing up individual currents from switched current source cells, compensation of capacitive feedback is an issue.

SUMMARY

Embodiments described herein refer inter alia to a digital-to-analog converter (DAC) for converting a digital input signal into an analog output signal. An input selector is provided which is configured to input the digital input signal which then may be used for controlling the DAC. Furthermore, an output terminal is provided which is configured to output the analog signal. According to an embodiment which can be combined with other embodiments described herein, the DAC is provided as a single-ended DAC.

Moreover, the DAC includes an array of current source cells, each current source cell including a current source transistor having a gate terminal and a source terminal. The current source transistor provides an output on the basis of the digital input signal. In order to provide an output, a current source switch is actuated, which is configured to couple the source terminal of the current source transistor to the output terminal on the basis of the digital input signal. Furthermore, each current cell includes a compensation capacitor configured to compensate a capacitive feedback between the gate terminal and the source terminal when the source terminal is coupled to the output terminal. At least one current source cell of the array of current source cells further includes a calibration circuit configured to detect a voltage variation at the gate terminal, which is an input bias node of the current source cell. The voltage variation at the gate terminal may be detected when the source terminal is coupled to the output terminal so that a compensation voltage may be provided for charging the compensation capacitor.

Furthermore, embodiments described herein refer inter alia to a compensation circuit for compensating a capacitive feedback between a gate terminal and a source terminal of the current source transistor. The source terminal is switchable to an output terminal for outputting a current which then is provided for external circuit units. The compensation circuit includes a compensation voltage source which may provide a compensation voltage, a compensation capacitor which is coupled between the gate terminal and the compensation voltage source, and a detection circuit coupled to the compensation voltage source and configured to detect a voltage variation at the gate terminal, when the source terminal is switched to the output terminal for outputting the current. Furthermore, the compensation voltage may be adjusted on the basis of the detected voltage variation at the gate terminal of the current source transistor so that the capacitive feedback is compensated.

In addition, embodiments described herein refer inter alia to a method for converting a digital input signal into an analog output signal. The method includes inputting the digital input signal into a circuit unit, switching at least one of an array of current source transistors included in the circuit unit, to an output terminal on the basis of the digital input signal. Then, a voltage variation may be detected at a gate terminal of at least one current source transistor of the array of current source transistors. The voltage variation at the gate terminal may be detected at a time when the current source transistor is switched to the output terminal. Furthermore, a capacitive feedback on the gate terminal based on the detected voltage variation may be compensated. The capacitive feedback may result from a capacitive coupling between the source terminal and the gate terminal of the at least one current source transistor. Then, the analog output signal is output from the output terminal.

Those skilled in the art will recognize additional features and advantages upon reading the following detailed description, and upon viewing the accompanying drawings.

BRIEF DESCRIPTION OF THE DRAWINGS

The invention can be better understood with reference to the following drawings and description. The components in the figures are not necessarily to scale, instead emphasis being placed upon illustrating the principles of the invention. Moreover, in the figures, like reference numerals designate corresponding parts. In the drawings.

DETAILED DESCRIPTION

Reference will now be made in detail to the various embodiments described herein, one or more examples of which are illustrated in the figures. Within the following description of the drawings, the same reference numbers refer to same components. Generally, only the differences with respect to individual embodiments are described. Each example is provided by way of explanation and is not intended as a limitation. For example, features illustrated or described as part of one embodiment can be used on or in conjunction with other embodiments to yield yet a further embodiment. It is intended that the present invention includes such modifications and variations.

Figure 1:
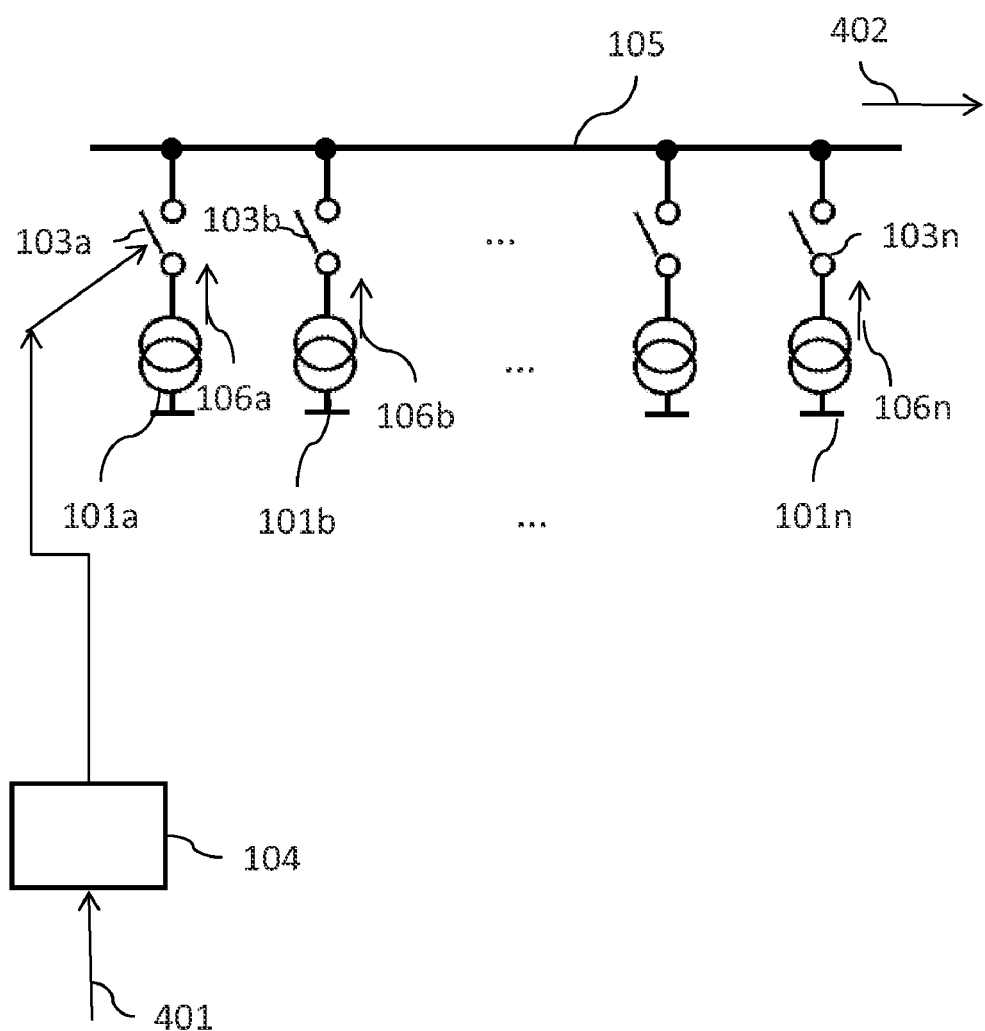
FIG. 1 shows a schematic view of a digital-to-analog converter including a plurality of current source cells according to an embodiment.

FIG. 1 illustrates a digital-to-analog converter (DAC) 100 in a schematic circuit arrangement. As shown in FIG. 1, a digital input signal 401 is provided at an input selector 104. The input selector 104 is designed to operate a plurality of current source switches 103a, 103b, ..., 103n of respective current source cells 101a-101n. The current source switches 103a-103n may be provided as transistors or any other means capable of a low-impedance connection of two terminals. The DAC 100 may include an array of current source cells 101a, 101b, ..., 101n. Each current source cell 101a-101n may output an individual output current 106a, 106b, ..., 106n.

The output currents 106a-106n may be differ from each other, in particular, the output currents may exhibit values corresponding to a digital code. For example, 1024 current source cells 101a-101n may be provided, wherein the first current source cell 106a may correspond to a least significant bit (LSB), wherein the $1024^{th}$ current source cell 106n may correspond to a most significant bit (MSB). Using the current source switches 103a-103n (1024 switches in the present example), a digital input word (input code) may be converted into an analog output current 106a-106n.

The individual output currents 106a-106n are summed up at an output terminal 105 and are outputted as the analog output signal 402. Thus, the analog output signal 402 may be outputted on the basis of the digital input signal 401. In order to obtain an analog output voltage on the basis of the analog output signal 402, e.g., a current-to-voltage operational amplifier may be used which may sum up the individual currents provided at the output terminal 105 and may then convert the summed-up currents into an output voltage (not shown in FIG. 1).

Figure 2:
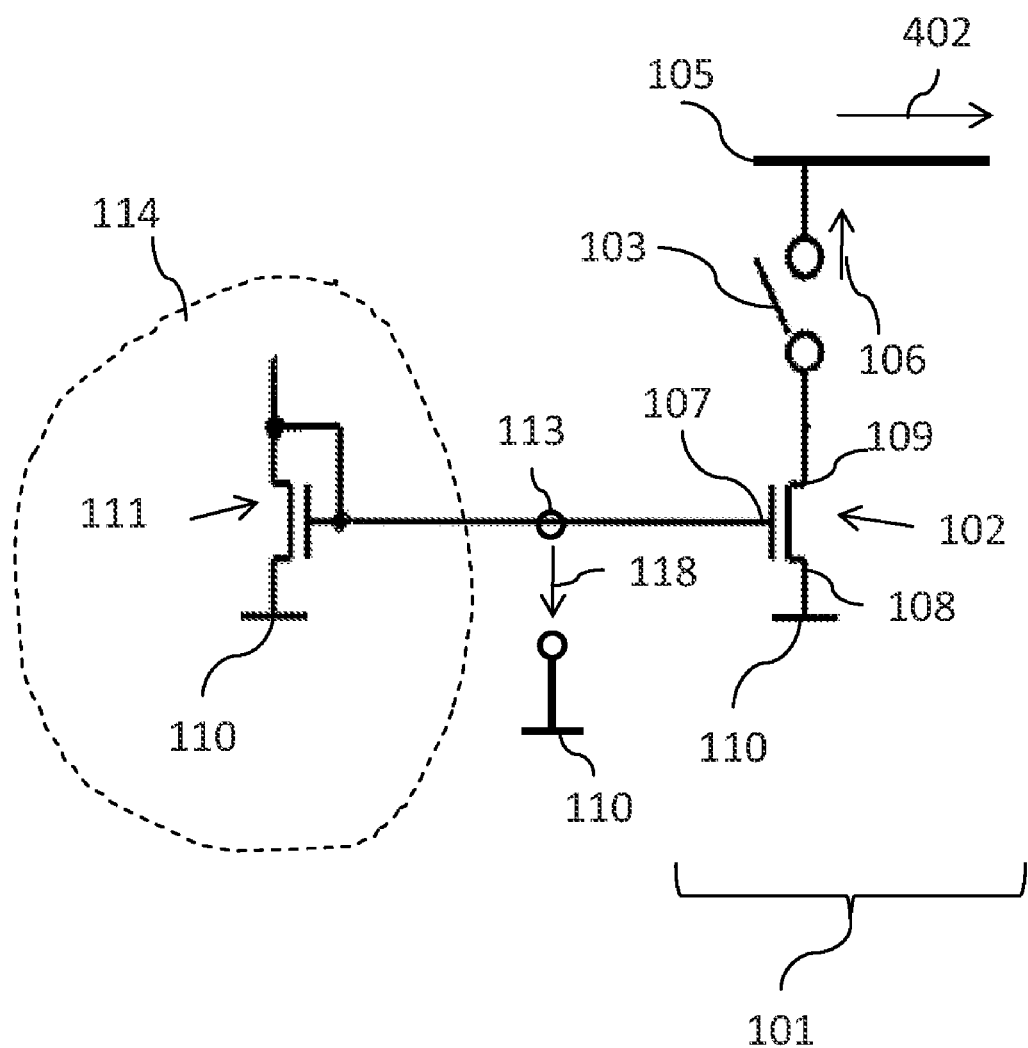
FIG. 2 illustrates a current source cell including a current source transistor and being fed by a bias voltage from a bias voltage source according to an embodiment.

FIG. 2 is a schematic view of a circuit arrangement illustrating a current source cell 101 in more detail. As shown in FIG. 2, the current source cell 101 is connected to a bias voltage source 114. The current source cell 101 includes a current source transistor 102 having a gate terminal 107, a drain terminal 108 and a source terminal 109. Furthermore, the current source cell 101 includes a current source switch 103 provided for coupling the source terminal 109 to the output terminal 105. When the current source switch 103 is closed, an output current may be provided by the current source cell 101 so that the output current contributes to the analog output signal 102 (arrow 106 in FIG. 2). In order to operate the current source cell 101, a bias voltage 118 may be provided at the gate terminal 107, i.e., the bias voltage 118 is provided between a bias node 113 and ground 110. The bias voltage 118 is generated by the bias voltage source 114 including a bias transistor 111.

When the current source switch 103 is closed, a voltage jump may occur at the source terminal 109, e.g., a voltage may rise from 0 volts to approximately 0.6 volts at a time when the current source cell is activated, i.e., when switch 103 is closed.

The voltage jump at the source terminal 109 when the current source cell is activated may result in a capacitive feedback between the source terminal 109 and the gate terminal 107 of the current source transistor 102. Due to the capacitive feedback transferred to the bias node 113, a voltage level on the bias node 113 may increase. Furthermore, if the current source switch 103 is switched off and on (toggled) at a high rate, a distortion occurs at the output terminal 105. Undesirable capacitive feedback from the source terminal 109 to the gate terminal 107 of the current source transistor 102 may be compensated by circuit arrangements described herein below with reference to FIGS. 3, 4 and 5.

Although a bias voltage 118 is provided by the bias voltage source 114 including the bias transistor 111, the bias voltage 118 may change when the current source switch 103 is closed. This change results from the capacitive feedback between the source terminal 109 and the gate terminal 107 of the current source transistor 102. The bias transistor 111 does not represent an ideal voltage source for providing the bias voltage 118 so that the capacitive feedback to the bias node 113, i.e., the gate 107 of the current source transistor 102 may increase the bias voltage 118 resulting in distortions with respect to the output current 106 of the current source cell 101.

Figure 3:
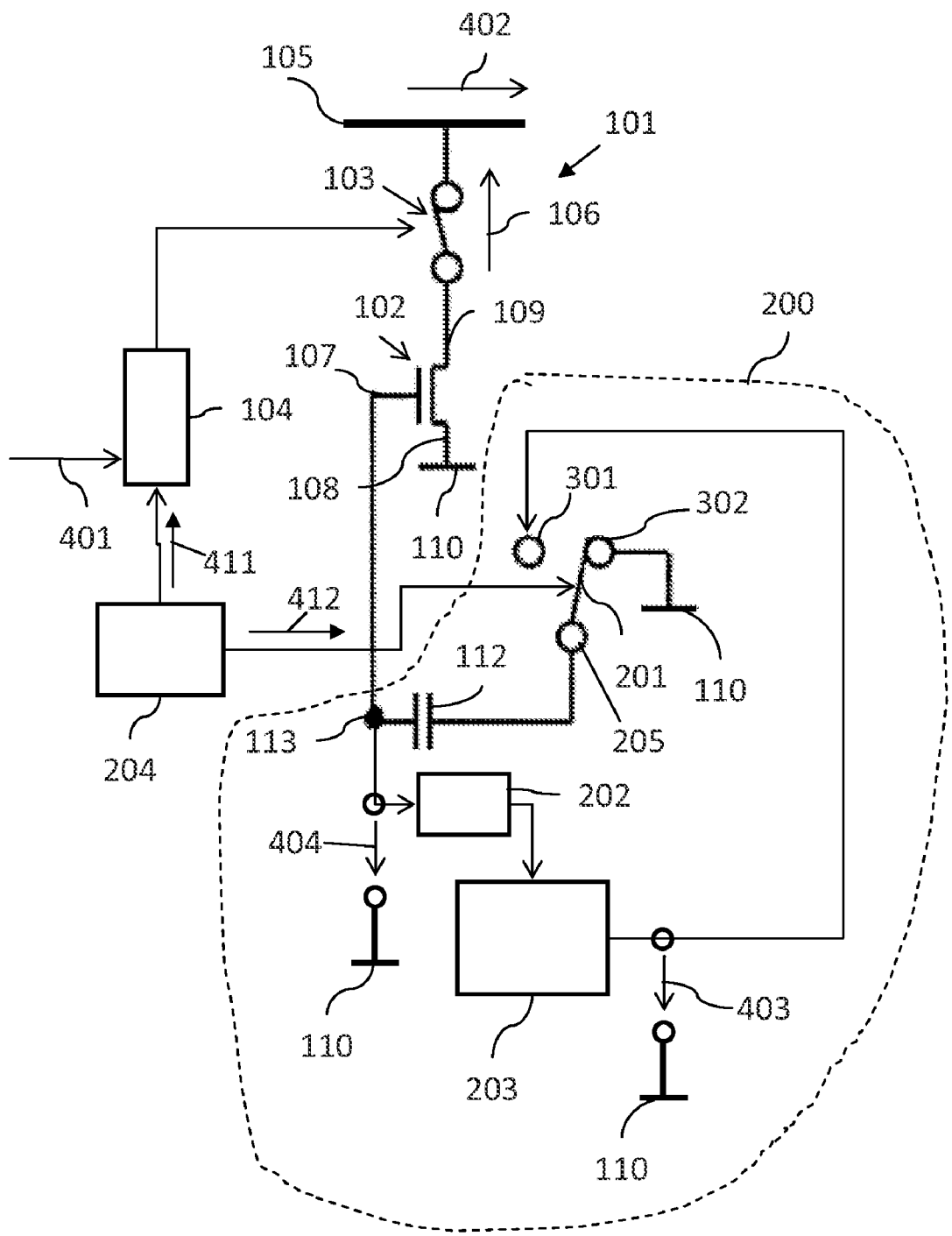
FIG. 3 illustrates a current source cell connected to a compensation circuit according to an embodiment.

FIG. 3 is a schematic circuit diagram showing a current source cell 101 connected to a compensation circuit 200. As shown in FIG. 3, the current source cell 101 includes a current source transistor 102 having a gate terminal 107, a source terminal 109 and a drain terminal 108. The drain terminal 108 is connected to ground 110. The source terminal 109 is connected to the current source switch 103 which provides an outflow of output current 106 toward the output terminal 105. The output current 106 of the current source cell 101 contributes to the analog output signal 402. The current source switch 103 is controlled by the input selector 104 receiving a digital input signal 401 and a first control signal 411. The first control signal 411 provides an activation of the current source cell 101 via current source switch 103.

The compensation circuit 200 includes a compensation capacitor 112 which compensates the capacitive feedback from the source terminal 109 to the gate terminal 107 of the current source transistor 102 when the current source transistor is coupled to the output terminal 105, i.e., when the source terminal 109 of the current source transistor 102 is connected to the output terminal 105.

The current source transistor 102 may be a field effect transistor (FET). The capacitive feedback may then result in an increased gate-drain charge. On the other hand, a charge provided for the compensation capacitor 112 depends on a compensation voltage 403 applied at the compensation capacitor if a switching unit 201 couples a main switch terminal 205 to a first switch terminal 301. The compensation voltage 403 which is suited for charging the compensation capacitor 112 so that the capacitive feedback at the current source transistor 102 is compensated is determined by measuring a voltage variation 404 by a detection circuit 202 included in the compensation circuit 200. Compensation of the gate-drain charge of the 102 may thus be achieved by charging the compensation capacitor 112 to a charge opposite the gate-drain charge.

To obtain a measure for the capacitive feedback to the gate terminal 107 of the current source transistor 102, the voltage variation 404 at the bias node 113 is measured, e.g., a voltage between the bias node 113 and ground 110 is detected. The detection circuit 202 receives the voltage variation 404 resulting from the capacitive feedback at the gate terminal 107 and outputs a compensation signal to the compensation voltage source 203. The compensation voltage source 203 provides the compensation voltage 403 applied at the compensation capacitor 112 when the switching unit 201 is switched to the first switch terminal 301 in a charging mode on the basis of the compensation signal.

The control unit 204 controls both the current source switch 103 and the switching unit 201 of the compensation circuit 200. When the switching unit 201 switches to the first switch terminal 301 (charging position), the current source switch 103 is opened. Then, when closing the current source switch 103 again so that the output current 106 may flow toward the output terminal 105, a voltage jump at the bias node 113 may be compensated by concurrently switching the switching unit 201 to a second switch terminal 302 which is connected to ground 110. Thus, a charge opposite the charge representing the capacitive feedback between the source terminal 109 and the gate terminal 107 of the current source switch 102 is present at the bias node 113.

A total charge which is deposited in the compensation capacitor 112 before closing the current source switch 103 may be determined as given by:

$$Q_{112} = U \times C_{112}, \quad (1)$$

wherein $Q_{112}$ represents the charge deposited at the compensation capacitor 112, U represents the voltage across the compensation capacitor 112 and $C_{112}$ represents the capacity of the compensation capacitor 112. Thus, in order to provide an appropriate charge for compensating the capacitive feedback mentioned above, the amount of charge $Q_{112}$ may be varied by the compensation voltage 403. The compensation voltage 403 may be adjusted by the compensation voltage source 203.

The control unit 204 may toggle both switches 103 and 201, e.g., the current source switch 103 and the switching unit 201 in an alternate manner, e.g., if switch 103 is closed, then switch 201 couples the compensation capacitor 112 to ground, and if switch 103 is closed, the compensation capacitor 112 connects terminals 205 and 301 in order to charge the compensation capacitor 112 with the compensation voltage 403. The detection unit 202 detects a voltage variation 404 at the bias node 113 whenever the compensation of the capacitive feedback to the gate terminal 107 of the current source transistor 102 is not fully achieved. A full compensation of the capacitive feedback results in a voltage variation 404 of approximately 0 volts. Once the detection circuit 202 detects a voltage variation 404 of approximately 0 volts, the compensation voltage source 203 holds the compensation voltage 403 at the adjusted level.

Then, a compensation of the capacitive feedback within the current source cell 101 is achieved. In this way, an appropriate value of the compensation voltage 403 for compensating capacitive feedback can be found, that is the compensation circuit 200 is calibrated. After calibrating the compensation circuit 200, the current source cell 101 may be connected to and disconnected from the output terminal 105 without generating a voltage variation 404 at the bias node 113. Due to temperature changes, changes in input bias current into the current source transistor 102, variation in the bias voltage, a value of a supply voltage of the circuit arrangement, and any combination thereof, a re-calibration may be necessary.

As described herein above, the voltage variation 404 is detected by the detection circuit 202 and a compensation control signal is provided for the compensation voltage source 203 so that a new compensation voltage 403 is found. Once the voltage variation 404 is approximately zero after connecting the source terminal 109 to the output terminal 105 by the current source switch 103, a new calibration has been found and the new compensation voltage 403 may be held at the output of the compensation voltage source 203.

Operation of the current source cell 101 shown in FIG. 3 is based on providing a bias voltage 118 provided by the bias voltage source 114 as described herein above with respect to FIG. 2. Bias voltage generation illustrated in FIG. 2 is not shown again in FIG. 3.

The compensation circuit 200 provides a compensation of the capacitive feedback between the gate terminal 107 and the source terminal 109 of the current source transistor 102, wherein the source terminal 109 is switchable to the output terminal 105 for outputting the output current 106 of the current source cell 101. The compensation voltage 403 provided by the compensation voltage source 203 is applied at the compensation capacitor 112 which in turn is coupled between the gate terminal 107 and the compensation voltage source 203, in a charging position.

The detection circuit 202 is coupled to the compensation voltage source 203 and is configured to detect the voltage variation 404 at the gate terminal 107, i.e., at the bias node 113, the voltage variation 404 occurring when the source terminal 109 is switched to the output terminal 105 for outputting the output current 106. The compensation voltage 203 is adjusted on the basis of the detected voltage variation 404 so that the capacitive feedback is compensated, at least partially.

The switching unit 201 is configured to couple the compensation capacitor 112 between the gate terminal 107 of the current source transistor 102 and the compensation voltage source 203, or between the gate terminal 107 and ground 110. Switching of the switching unit 201 is controlled by the control unit 204 so that the switching unit 201 connects the main switch terminal 205 to the second switch terminal 302 when the current source switch 103 is closed by control of the first control signal 411 of the control unit 204.

Thus, the compensation circuit 200 provides an adjustable compensation voltage 403 so that the voltage variation 404 is lowered to a value of approximately 0 volts. In other words, the capacitive feedback on the gate terminal 107 is compensated by the compensation voltage 403 applied at the compensation capacitor 112 so that a resulting compensation charge $Q_{112}$ deposited in the compensation capacitor 112 compensates a gate-drain charge of the current source transistor 102. Thus, the voltage for the compensation is determined by a calibration process so that a charge transferred to the bias node 113 is cancelled by an opposite charge provided by the compensation capacitor 112.

Figure 4:
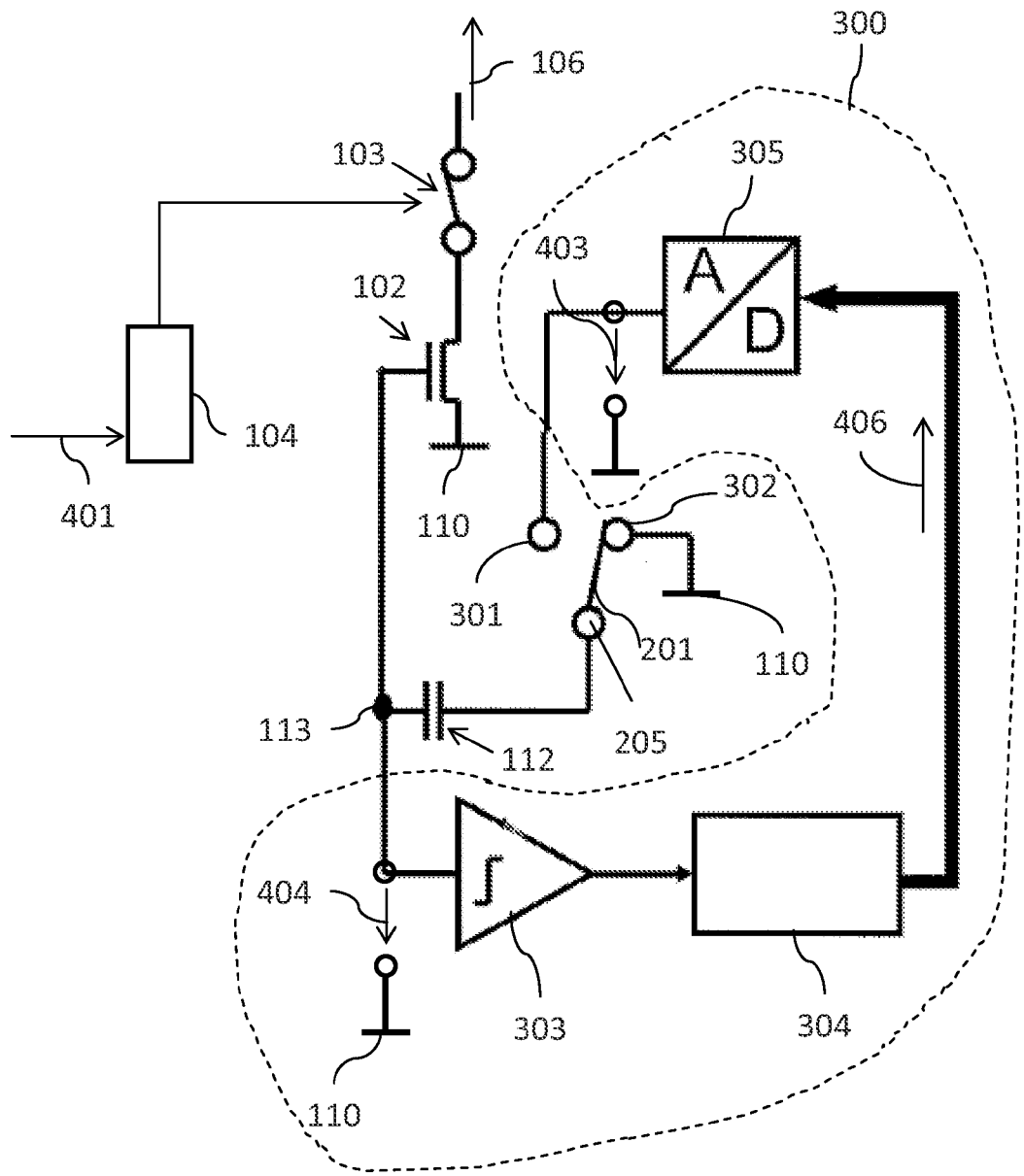
FIG. 4 is a circuit diagram of a calibration circuit connected to a current source cell according to an embodiment.

FIG. 4 is a schematic diagram of a circuit arrangement for calibrating a compensation of capacitive feedback in a current source transistor 102. As shown in FIG. 4, a calibration circuit 300 includes a comparator circuit 303, an up-down counter 304 and an auxiliary digital-to-analog converter 305.

The current source cell 101 shown in FIG. 4 may be one of a plurality of a current source cells 101a-101n of a DAC 100 described herein above with respect to FIG. 1. Each current source cell 101a-101n of the DAC 100 may include the current source transistor 102 having a gate terminal 107 and a source terminal 109 and providing an output current 106, a current source switch 103 configured to couple the source terminal 109 to the output terminal 105 based on a digital input signal 401, and the compensation capacitor 112 configured to compensate the capacitive feedback between the gate terminal 107 and the source terminal 109 when the source terminal 109 is coupled to the output terminal 105.

The current source cell 101 shown in FIG. 4 may be provided as a replica cell, which is arranged in addition to the current source cells used for DAC operation. A replica cell denotes a cell which is identical or nearly identical to the current source cells of the DAC 100, but which is only used for compensation and/or calibration purposes and not for DAC operation. The current source cell 101 shown in FIG. 4 further includes the calibration circuit 300 for detecting the voltage variation 404 at the gate terminal 107, i.e., at the bias node 113, when the source terminal 109 is coupled to the output terminal 105. Furthermore, the calibration circuit 300 provides the compensation voltage 403 for the compensation capacitor 112. Thus, the replica cell is designed in a similar manner as the current source cells 101 of the DAC 100 shown in FIG. 1, e.g., for a number of 1024 current source cells 101, a number of 1024 current source transistors 102, 1024 compensation capacitors 112 and a number of 1024 switching units 201 are provided.

Each current source cell 101a-101n of the DAC 100 receives the same compensation voltage 403 provided by the calibration circuit 300 of the replica cell shown in FIG. 4 so that the individual voltage variations 404 of the current source cells 101a-101n may be reduced to zero or approximately zero. Thus the capacitive feedback at an individual current source transistor 102a-102n of an individual current source cell 101a-101n (see FIG. 1) is compensated. The compensation voltage 403 may be the same for all current source cells 101a-101n of a DAC 100, because, even if a mismatch between the capacitive feedback and the compensation capacitor 112 is present, this mismatch is identical or nearly identical for all current source cells 101a-101n. Thus, the calibration circuit 300 is provided once in combination with the replica cell shown in FIG. 4.

Although only one replica cell is shown in the circuit arrangement of the calibration circuit 300, two or more replica cells may be provided within the calibration circuit 300. As compared to the circuit arrangement shown in FIG. 3, the compensation voltage source in FIG. 4 is provided by an analog output of the auxiliary analog-digital converter 305. The comparator 303 of the calibration circuit 300 detects the voltage variation 404 by comparing the voltage variation 404 at the bias node 113 (i.e., at the gate terminal of the current source transistor 102) to a predetermined voltage value and outputs a comparator signal based on the comparison.

The comparator signal is fed to the up-down counter 304 connected to an output terminal of the comparator circuit. The up-down counter 304 provides a digital control signal 406 based on the comparator signal. The digital control signal 406 serves as a DAC input code for the auxiliary digital-to-analog converter 305. The auxiliary digital-to-analog converter 305 converts the DAC input code, i.e., the digital control signal 406 into the compensation voltage 403 provided for the compensation capacitor 112. The up-down counter 304 provided in the calibration circuit 300 may be designed as a digital filter unit. The control unit 204 shown in FIG. 3 may toggle both switches 103 and 201, e.g., the current source switch 103 and the switching unit 201 in an alternate manner, e.g., if switch 103 is closed, then switch 201 couples the compensation capacitor 112 to ground 110, and if switch 103 is closed, the compensation capacitor 112 connects terminals 205 and 301 in order to charge the compensation capacitor 12 with the compensation voltage 403.

Figure 5:
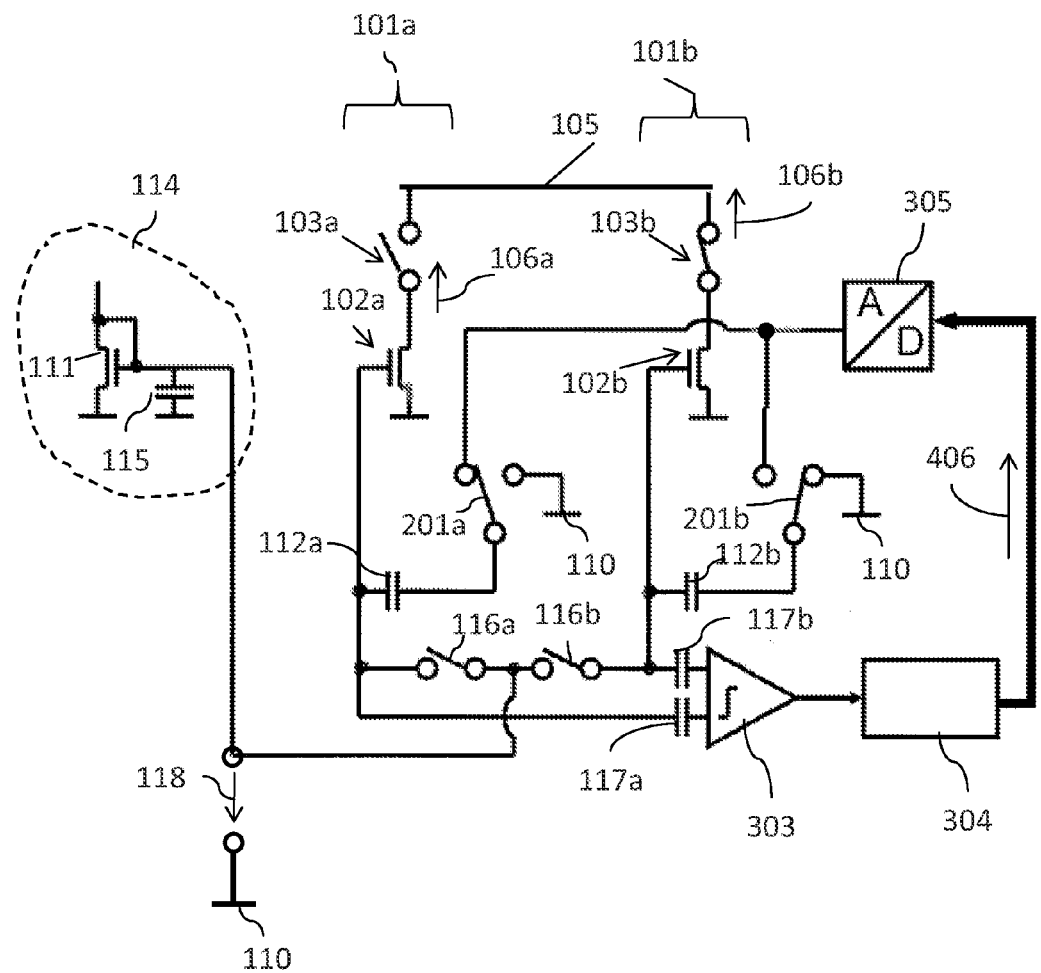
FIG. 5 is a calibration circuit for two current source cells operated in a differential mode according to an embodiment.

FIG. 5 is a schematic circuit diagram illustrating a calibration circuit according to yet another embodiment which can be combined with other embodiments described herein. FIG. 5 illustrates a differential operation mode of at least two replica current source cells 101a, 101b including respective current source transistors 102a, 102b. Each current source cell 101a, 101b includes a switching unit 201a, 201b and a compensation capacitor 112a, 112b. Furthermore, the replica current source cells 101a, 101b include current source switches 103a, 103b for connecting the respective current source cell 101a, 101b to an output terminal 105 so that respective output currents 106a, 106b can be provided as output signals.

Furthermore, a bias voltage source 114 including a bias transistor 111 and a capacitor 115 connecting the output of the bias voltage source 114 to ground are provided. The bias voltage source 114 provides, as its output, the bias voltage 118, which may be applied at input capacitors 117a, 117b of the comparator circuit 303 and which is switchable via bias switches 116a, 116b. The respective bias voltages 118 applied at the operator circuit 303 are held by the input capacitors 117a, 117b. An additional voltage variation caused by closing the current source switches 103a, 103b may then be compensated by the compensation circuit and calibrated by the calibration circuit including the comparator circuit 303, the up-down counter 304 and the auxiliary digital-to-analog converter 305.

Although not shown in FIG. 5, a control unit is provided for toggling the switches 103a, 103b, 201a and 201b in an alternating manner. In other words, when current source switch 103b is closed, as shown in FIG. 5, current source switch 103a is opened and vice versa. In addition, compensation capacitor 112a is switched to the output of the auxiliary digital-to-analog converter 305 when compensation capacitor 112b is switched to ground 110 and vice versa. The comparator circuit 303 detects voltage variations at its inputs and thus is able to set the up-down counter 304 to a value resulting in a compensation voltage 404 at the output of the auxiliary digital-to-analog converter 305 so that a voltage variation due to switching the switches 103a and 103b, respectively, to the output terminal 105 is compensated, i.e., a capacitive feedback occurring at the current source transistors 102a, 102b is compensated by the charge deposited in compensation capacitors 112a, 112b. In this way, by compensating the capacitive feedback, interferences on the output signal are eliminated or at least reduced.

The current source cells 101a, 101b including the current source transistors 102a, 102b are replica cells, that is cells which are identical or nearly identical to the current source cells of the DAC 100, but which are used for compensation and/or calibration purposes and not for DAC operation. Although two current source cells 101a, 101b (replica cells) are shown, the present application is not restricted to a calibration circuit including two current source cells 101a, 101b, rather one, or more than two current source cells 101a-101n may be provided for the calibration circuit. Here, at least two current source transistors 102a, 102b provided in the circuit arrangement shown in FIG. 5 are operated in compensation modes shifted in phase by approximately 180 degrees. Preloading during the offset compensation phase of the comparator is provided because the capacity of the current source transistors 102a, 102b depends on the applied bias voltage 118.

Figure 6:
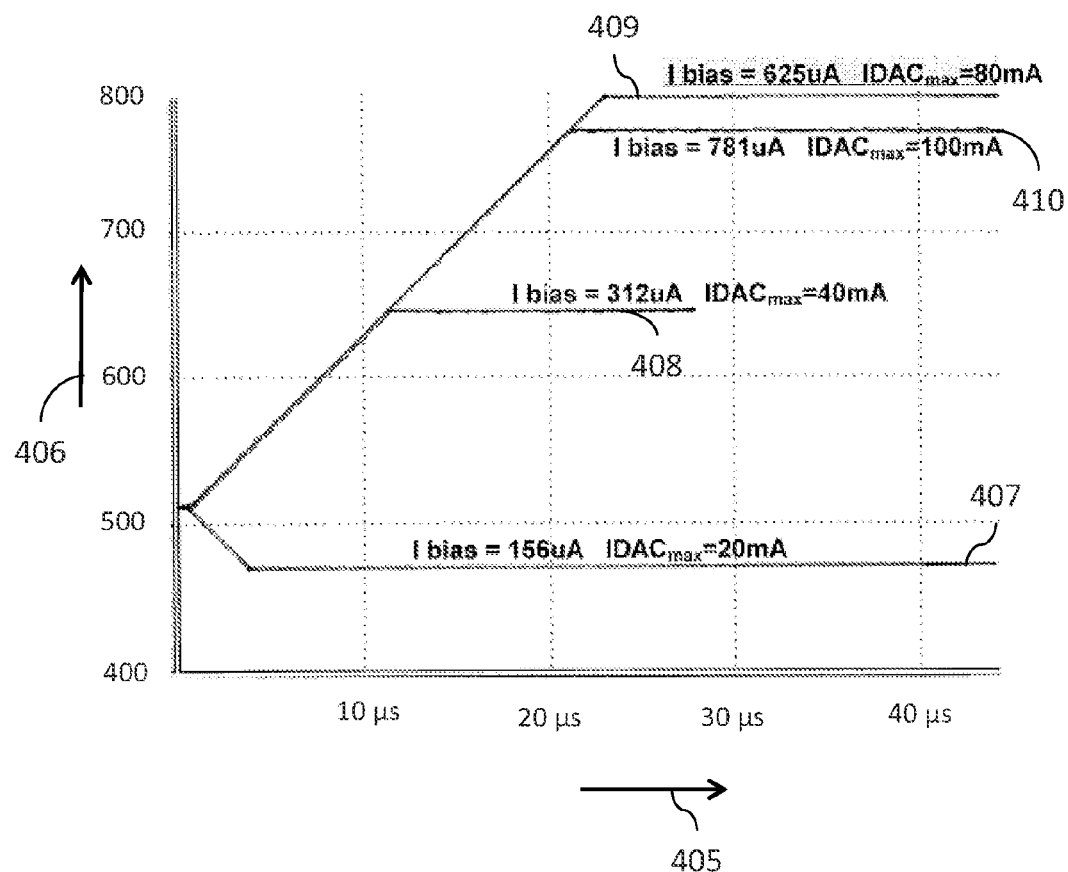
FIG. 6 shows a graph illustrating an adjustment of a compensation voltage on the basis of a bias current and an output current of the digital-to-analog converter.

FIG. 6 is a graph illustrating an operation principle of the calibration procedure according to an embodiment which can be combined with other embodiments described herein. The curves shown in FIG. 6 represent different compensation situations as a function of time 405. A time axis 405 is the x-axis in units of 10 microseconds (μs). The y-axis corresponds to a DAC input code 406 into the auxiliary digital-to-analog converter 305 shown in FIGS. 4 and 5.

A first compensation curve 407 is obtained by detecting the DAC input code into the auxiliary digital-to-analog converter 305 after changing the bias current flowing into the current cell 101 shown in FIG. 4 to 156 μA and by obtaining an output current of the DAC 100 of 20 mA. A second compensation curve 408 is obtained at a bias current $I_{bias}$ of 312 μA and a DAC output current of 40 mA, and a third compensation curve 409 is obtained at a bias current of 625 µA resulting in a DAC output current of 80 mA. As a further example, a fourth compensation curve 410 is shown at a bias current of 781 µA and an output current of the DAC 100 (FIG. 1) of 100 mA. As can be seen from the compensation curves shown in FIG. 6, the DAC input code 406 may not be determined unambiguously from the output current of the DAC 100, rather a calibration procedure taking into account the voltage variation 404 at the bias node 113 is required.

Figure 7:
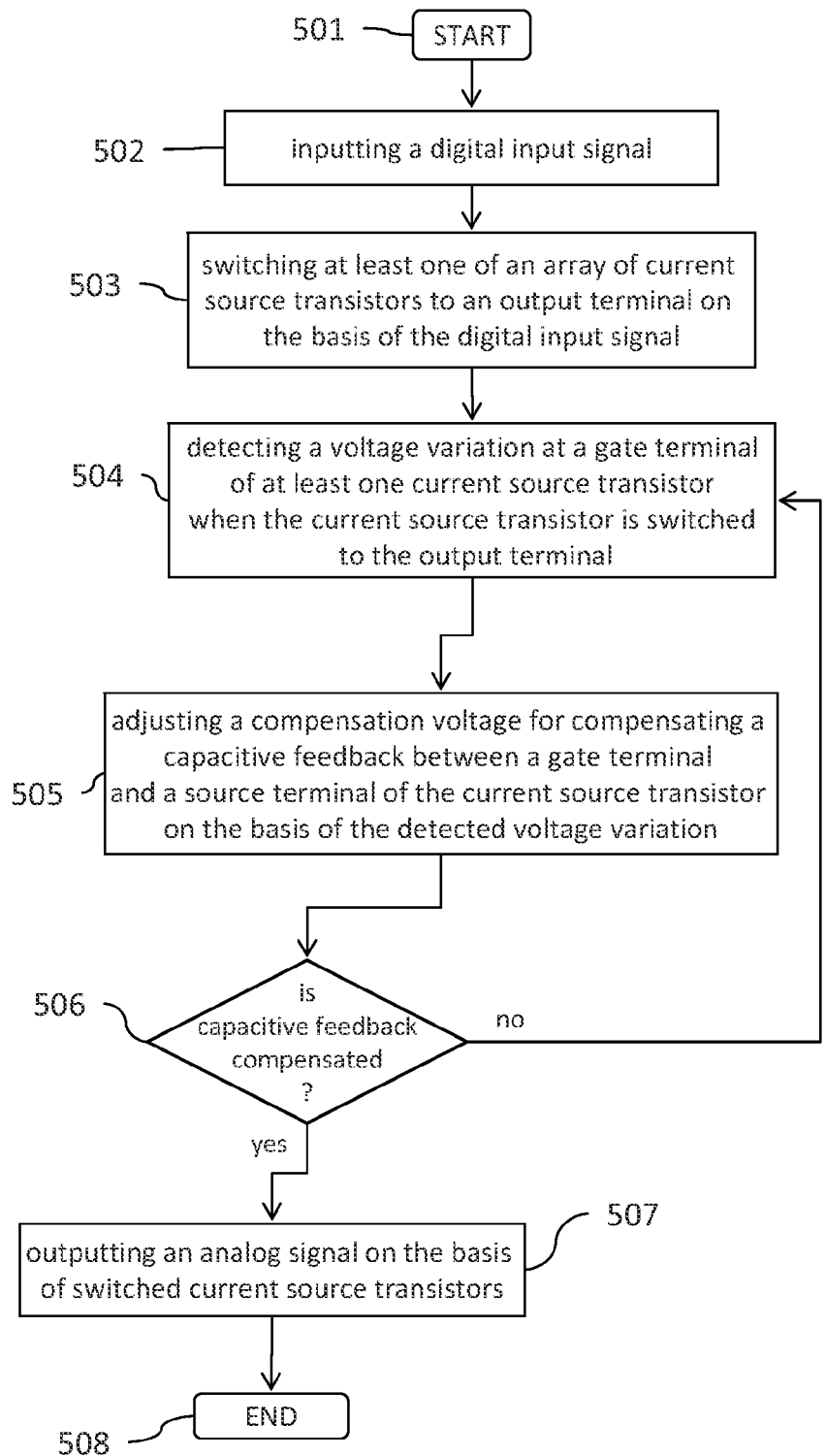
FIG. 7 shows a flowchart illustrating a method for converting a digital input signal into an analog output signal according to an embodiment.

FIG. 7 is a flowchart illustrating a method for converting a digital input signal 401 into an analog output signal 402. At step 501 the procedure is started. The digital input signal 401 is input at step 502. Then, at least one of the array of current source transistors 102a-102n is switched to an output terminal 105 on the basis of the digital input signal 401 (step 503). During switching by the current source switches 103, a voltage variation 404 is detected at a gate terminal 107 of at least one current source transistor 102a-102n, when the current source transistor 102a-102n is switched to the output terminal 105 (step 504).

A compensation voltage 403 for compensating a capacitive feedback between the gate terminal 107 and the source terminal 109 of the current source transistor 102a, 102n is then adjusted based on the detected voltage variation 404 (step 505). The voltage variation 404 results from a mismatch of a capacitance of the compensation capacitor 112 with respect to the capacitive feedback. The mismatch can be assumed to be the same or nearly the same for all current source cells 101a-101n of the DAC 100. It is determined whether or not the capacitive feedback between the source terminal 109 and the gate terminal 107 of the current source transistor 102 is compensated (step 506). If the capacitive feedback is compensated ("yes"), the analog signal 402 is output on the basis of switched current source transistors 102a-102n (step 507) and the procedure ends (step 508). If it is determined that the capacitive feedback is not compensated ("no"), the procedure returns to step 504 where another voltage variation 404 is detected at the gate terminal 107 (i.e., at the bias node 113). Steps 505 and 506 are then carried out again.

Thus, the calibration process for determining the compensation voltage may be provided. An accurate compensation without knowledge of other parameters except for the assumption of an identical or nearly identical mismatch in the individual current source cells 101a-101n may be achieved. After the calibration procedure, the calibration circuit 300 may be deactivated to save supply power.

As shown in FIGS. 4 and 5, the auxiliary digital-to-analog converter 305 serving as a current source for providing the compensation voltage 403 may hold its output voltage after stopping the calibration process. Thus, the compensation voltage 403 is held at the adjusted level before deactivating the calibration circuit 300. In some situations, the deactivated calibration circuit 300 may be reactivated after a variation of at least one of a bias voltage, a bias current, an operation temperature, and a supply voltage has occurred.

While the foregoing is directed to embodiments of the invention, other and further embodiments of the invention may be devised without departing from the basic scope thereof, and the scope thereof is determined by the claims that follow.

Terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A compensation circuit for compensating a capacitive feedback between a gate terminal and a source terminal of a current source transistor, the source terminal being switchable to an output terminal for outputting an output current, the compensation circuit comprising:
   a compensation voltage source configured to provide a compensation voltage;
   a compensation capacitor coupled between the gate terminal and the compensation voltage source; and
   a detection circuit coupled to the compensation voltage source and configured to detect a voltage variation at the gate terminal when the source terminal is switched to the output terminal for outputting the output current,
   wherein the compensation voltage is adjusted based on the detected voltage variation so that the capacitive feedback is compensated.

2. The compensation circuit in accordance with claim 1, further comprising a switching unit configured to couple the compensation capacitor between the gate terminal and the compensation voltage source, or between the gate terminal and ground.

3. The compensation circuit in accordance with claim 1, further comprising a comparator circuit configured to compare the voltage variation at the gate terminal to a predetermined voltage value and output a comparator signal based on the comparison.

4. The compensation circuit in accordance with claim 3, further comprising an up-down counter connected to an output terminal of the comparator circuit and configured to provide a digital control signal based on the comparator signal.

5. The compensation circuit in accordance with claim 4, further comprising an auxiliary digital-to-analog converter configured to convert the digital control signal into the compensation voltage.

6. The compensation circuit in accordance with claim 4, wherein the up-down counter is a digital filter unit.

7. A digital-to-analog converter for converting a digital input signal into an analog output signal, comprising:
   an input selector configured to input the digital input signal;
   an output terminal configured to output the analog signal; and
   an array of current source cells, each current source cell comprising:
      a current source transistor having a gate terminal and a source terminal and configured to provide an output current;
      a current source switch configured to couple the source terminal to the output terminal based on the digital input signal; and
      a compensation capacitor configured to compensate a capacitive feedback between the gate terminal and the source terminal when the source terminal is coupled to the output terminal,
   wherein at least one of the current source cells further comprises a calibration circuit configured to detect a voltage variation at the gate terminal when the source terminal is coupled to the output terminal and provide a compensation voltage for the compensation capacitor.

8. The digital-to-analog converter in accordance with claim 7, wherein the calibration circuit comprises an adjustable compensation voltage source configured to provide the compensation voltage.

9. The digital-to-analog converter in accordance with claim 7, wherein the at least one current source cells further comprises a switching unit configured to couple the compensation capacitor between the gate terminal and the compensation voltage source, or between the gate terminal and ground.

10. The digital-to-analog converter in accordance with claim 7, wherein the calibration circuit further comprises a comparator circuit configured to compare the voltage variation at the gate terminal to a predetermined voltage value and output a comparator signal based on the comparison.

11. The digital-to-analog converter in accordance with claim 10, wherein the calibration circuit further comprises an up-down counter connected to an output terminal of the comparator circuit and configured to provide a digital control signal based on the comparator signal.

12. The digital-to-analog converter in accordance with claim 11, wherein the calibration circuit further comprises an auxiliary digital-to-analog converter configured to convert the digital control signal into the compensation voltage.

13. The digital-to-analog converter in accordance with claim 7, wherein the current source transistor is a field effect transistor.

14. A method for converting a digital input signal into an analog output signal, comprising:
  inputting the digital input signal;
  switching at least one of an array of current source transistors to an output terminal based on the digital input signal;
  detecting a voltage variation at a gate terminal of at least one current source transistor when the current source transistor is switched to the output terminal;
  compensating capacitive feedback on the gate terminal based on the detected voltage variation; and
  outputting the analog output signal from the output terminal.

15. The method in accordance with claim 14, wherein the capacitive feedback on the gate terminal is compensated by a compensation voltage applied at a compensation capacitor so that a resulting compensation charge of the compensation capacitor compensates a gate-drain charge of the current source transistor.

16. The method in accordance with claim 15, further comprising implementing a calibration procedure for providing the compensation voltage by a calibration circuit.

17. The method in accordance with claim 16, wherein the gate terminal is preloaded with a bias voltage during the calibration procedure.

18. The method in accordance with claim 16, wherein the calibration circuit is deactivated after the calibration procedure.

19. The method in accordance with claim 18, wherein the compensation voltage is held at an adjusted level before deactivating the calibration circuit.

20. The method in accordance with claim 18, wherein the calibration circuit is reactivated after a variation of at least one of a bias voltage at the gate terminal and an operation temperature.

21. The method in accordance with claim 14, wherein at least two current source transistors are operated in compensation modes shifted in phase by approximately 180 degrees.

* * * * *